US010205432B2

United States Patent
Yokoyama et al.

(10) Patent No.: US 10,205,432 B2
(45) Date of Patent: Feb. 12, 2019

(54) PIEZOELECTRIC THIN FILM RESONATOR, FILTER, AND DUPLEXER

(71) Applicant: TAIYO YUDEN CO., LTD., Tokyo (JP)

(72) Inventors: Tsuyoshi Yokoyama, Tokyo (JP); Jiansong Liu, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 151 days.

(21) Appl. No.: 15/356,197

(22) Filed: Nov. 18, 2016

(65) Prior Publication Data

US 2017/0170809 A1 Jun. 15, 2017

(30) Foreign Application Priority Data

Dec. 14, 2015 (JP) ................................. 2015-243624

(51) Int. Cl.
*H03H 9/17* (2006.01)
*H03H 9/58* (2006.01)
(Continued)

(52) U.S. Cl.
CPC .......... *H03H 9/02157* (2013.01); *H03H 9/13* (2013.01); *H03H 9/173* (2013.01);
(Continued)

(58) Field of Classification Search
CPC .......... H03H 9/02086; H03H 9/02118; H03H 9/02157; H03H 9/133; H03H 9/173;
(Continued)

(56) References Cited

U.S. PATENT DOCUMENTS 6,297,515 B1 * 10/2001 Yuan ................. H03B 5/30
257/14
8,456,257 B1 * 6/2013 Fattinger ............ H03H 9/02086
310/312
(Continued)

FOREIGN PATENT DOCUMENTS

JP 07-336184 A 12/1995
JP 2006-020277 * 1/2006
(Continued)

OTHER PUBLICATIONS

English language machine translation of JP 2006-020277, published Jan. 19, 2006, 7 pages.*
(Continued)

*Primary Examiner* — Barbara Summons
(74) *Attorney, Agent, or Firm* — Chen Yoshimura LLP

(57) ABSTRACT

A piezoelectric thin film resonator includes: a piezoelectric film located on a substrate, and formed of stacked lower and upper piezoelectric films; lower and upper electrodes facing each other across at least a part of the piezoelectric film; and an insertion film inserted between the lower and upper piezoelectric films, wherein an air gap including a resonance region where the lower and upper electrodes face each other across the piezoelectric film and being larger than the resonance region is located under the lower electrode, and a multilayered film formed of the lower piezoelectric film, the insertion film, and the upper piezoelectric film is located in at least a part of a region located further out than an outer outline of the resonance region, further in than an outer outline of the air gap, and surrounding the resonance region, and is not located in a center region of the resonance region.

11 Claims, 13 Drawing Sheets

(51) Int. Cl.
  *H03H 9/70* (2006.01)
  *H03H 9/02* (2006.01)
  *H03H 9/13* (2006.01)
  *H03H 9/60* (2006.01)
(52) U.S. Cl.
  CPC ............ *H03H 9/175* (2013.01); *H03H 9/587* (2013.01); *H03H 9/589* (2013.01); *H03H 9/605* (2013.01); *H03H 9/706* (2013.01); *H03H 9/02118* (2013.01)
(58) Field of Classification Search
  CPC ............ H03H 9/48; H03H 9/54; H03H 9/587; H03H 9/706; H03H 9/13; H03H 9/175; H03H 9/589; H03H 9/605
  USPC ......................................... 333/187, 189, 133
  See application file for complete search history.

(56) References Cited

U.S. PATENT DOCUMENTS

| | | | |
|---|---|---|---|
| 8,854,156 B2 * | 10/2014 | Iwashita | H03H 3/02 310/312 |
| 9,048,812 B2 | 6/2015 | Burak et al. | |
| 2006/0071736 A1 | 4/2006 | Ruby et al. | |
| 2006/0091764 A1 * | 5/2006 | Tsutsumi | H03H 9/02118 310/324 |
| 2006/0103492 A1 | 5/2006 | Feng et al. | |
| 2007/0096597 A1 | 5/2007 | Taniguchi et al. | |
| 2007/0120625 A1 * | 5/2007 | Larson, III | H03H 3/04 333/189 |
| 2007/0161903 A1 * | 7/2007 | Yamashita | A61B 8/14 600/459 |
| 2007/0210877 A1 * | 9/2007 | Osugi | H03H 3/02 333/187 |
| 2009/0001848 A1 | 1/2009 | Umeda et al. | |
| 2011/0204996 A1 * | 8/2011 | Gilbert | H03H 9/50 333/191 |
| 2012/0218057 A1 | 8/2012 | Burak et al. | |
| 2012/0218060 A1 * | 8/2012 | Burak | H03H 3/04 333/191 |
| 2012/0256706 A1 * | 10/2012 | Sakashita | H03H 3/02 333/187 |
| 2014/0210570 A1 | 7/2014 | Nishihara et al. | |
| 2014/0232486 A1 | 8/2014 | Burak | |
| 2015/0130559 A1 | 5/2015 | Yokoyama et al. | |
| 2017/0207768 A1 * | 7/2017 | Liu | H03H 9/173 |

FOREIGN PATENT DOCUMENTS

| | | | | |
|---|---|---|---|---|
| JP | 2006-109472 | A | 4/2006 | |
| JP | 2006-128993 | * | 5/2006 | ......... H03H 9/02118 |
| JP | 2007-124166 | A | 5/2007 | |
| JP | 2007-227998 | * | 9/2007 | |
| JP | 2014-161001 | A | 9/2014 | |
| JP | 2015-095729 | A | 5/2015 | |
| JP | 2015-154492 | A | 8/2015 | |

OTHER PUBLICATIONS

English language machine translation of JP 2007-227998, published Sep. 6, 2007, 10 pages.*
Japanese Office Action dated Jan. 30, 2018, in a counterpart Japanese patent application No. 2015-243624. (A machine translation (not reviewed for accuracy) attached.).

* cited by examiner

FIG. 7A
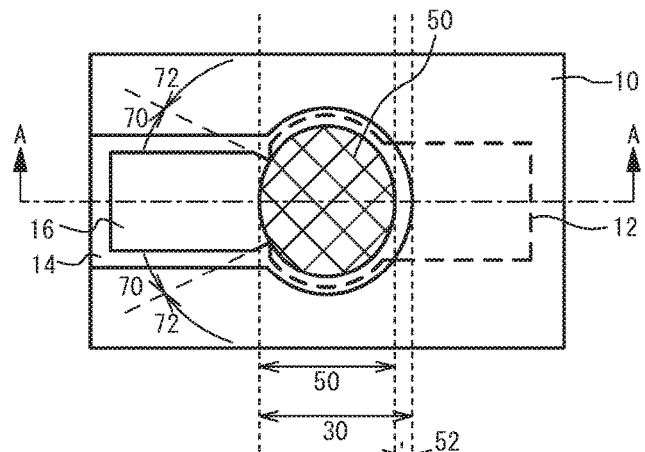
FIG. 7B
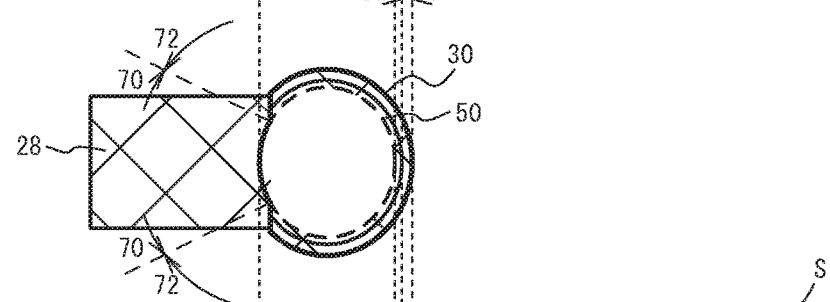
FIG. 7C
FIG. 7D
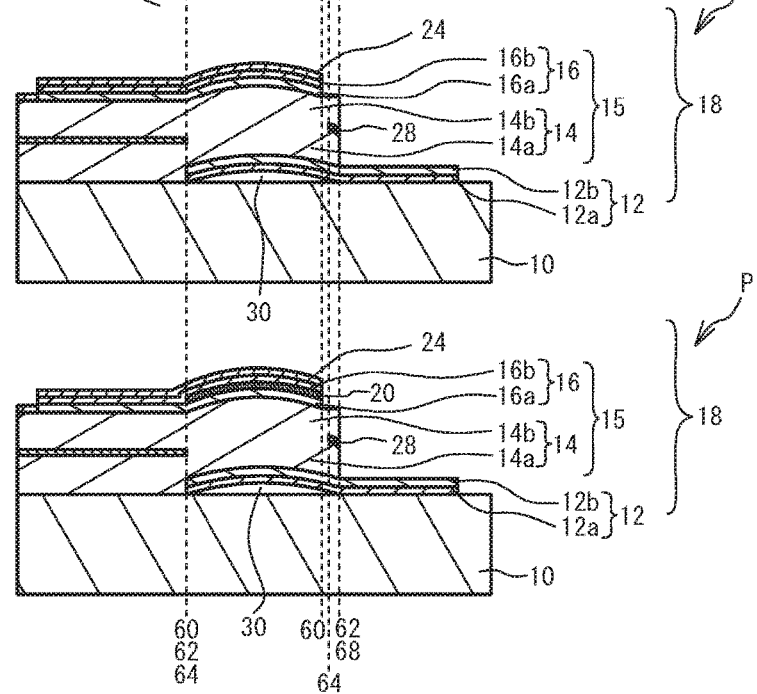

FIG. 12

|  | Q-VALUE $Q_a$ AT ANTIRESONANT FREQUENCY | ELECTROMECHANICAL COUPLING COEFFICIENT $k^2$ [%] |
|---|---|---|
| FIRST COMPARATIVE EXAMPLE | 1685 | 7.10 |
| SECOND COMPARATIVE EXAMPLE | 928 | 7.20 |
| THIRD COMPARATIVE EXAMPLE | 1370 | 7.25 |
| FIRST VARIATION | 2324 | 7.27 |
| SECOND VARIATION | 2107 | 7.27 |
| THIRD VARIATION | 2188 | 7.27 |

PIEZOELECTRIC THIN FILM RESONATOR, FILTER, AND DUPLEXER

CROSS-REFERENCE TO RELATED APPLICATION

This application is based upon and claims the benefit of priority of the prior Japanese Patent Application No. 2015-243624, filed on Dec. 14, 2015, the entire contents of which are incorporated herein by reference.

FIELD

A certain aspect of the present invention relates to a piezoelectric thin film resonator, a filter, and a duplexer.

BACKGROUND

Acoustic wave devices using piezoelectric thin film resonators have been used as filters and duplexers of wireless devices such as, for example, mobile phones. The piezoelectric thin film resonator has a structure designed to have a lower electrode and an upper electrode facing each other across a piezoelectric film. The region where the lower electrode and the upper electrode face each other across the piezoelectric film is a resonance region.

The rapid diffusion of wireless systems has promoted the use of many frequency bands. Thus, filters or duplexers with steeper skirt characteristics have been desired. One way of making the skirt characteristic steeper is to increase the Q-value of the piezoelectric thin film resonator.

Japanese Patent Application Publication No. 2006-109472 (Patent Document 1) discloses a piezoelectric thin film resonator including an annulus on a surface of one of the upper electrode and the lower electrode. Japanese Patent Application Publication No. 2014-161001 (Patent Document 2) discloses a piezoelectric thin film resonator including an insertion film inserted into the piezoelectric film in the outer peripheral region of the resonance region. U.S. Pat. No. 9,048,812 (Patent Document 3) discloses a piezoelectric thin film resonator including an annulus called a bridge in the piezoelectric film.

The piezoelectric thin film resonators of Patent Documents 1 through 3 can reduce the leak of the acoustic wave energy from the resonance region and improve the Q-value. However, since the annulus or the insertion film is located in the resonance region, the characteristics including the electromechanical coupling coefficient deteriorate.

SUMMARY OF THE INVENTION

According to a first aspect of the present invention, there is provided a piezoelectric thin film resonator including: a substrate; a piezoelectric film that is located on the substrate, and is formed of a lower piezoelectric film and an upper piezoelectric film that are stacked; a lower electrode and an upper electrode that face each other across at least a part of the piezoelectric film; and an insertion film that is inserted between the lower piezoelectric film and the upper piezoelectric film, wherein an air gap or an acoustic mirror that includes a resonance region in which the lower electrode and the upper electrode face each other across the piezoelectric film and is larger than the resonance region in plan view is located under the lower electrode, and a multilayered film formed of the lower piezoelectric film, the insertion film, and the upper piezoelectric film that are stacked is located in at least a part of a region that is located further out than an outer outline of the resonance region, further in than an outer outline of the air gap or an outer outline of the acoustic mirror, and surrounds the resonance region, and the multilayered film is not located in a center region of the resonance region.

According to a second aspect of the present invention, there is provided a filter including: the above piezoelectric thin film resonator.

According to a third aspect of the present invention, there is provided a duplexer including: the above filter.

BRIEF DESCRIPTION OF THE DRAWINGS

FIG. 7A is a plan view of a piezoelectric thin film resonator in accordance with a sixth embodiment, FIG. 7B is a plan view of an insertion film and an air gap, and FIG. 7C and FIG. 7D are cross-sectional views taken along line A-A in FIG. 7A;

FIG. 12 illustrates a Q-value at an antiresonant frequency and an electromechanical coupling coefficient $k^2$ in the first through third comparative examples and the first through third variations of the first embodiment.

DETAILED DESCRIPTION

Hereinafter, embodiments of the present invention will be described with reference to the accompanying drawings.

First Embodiment

Figure 1A:
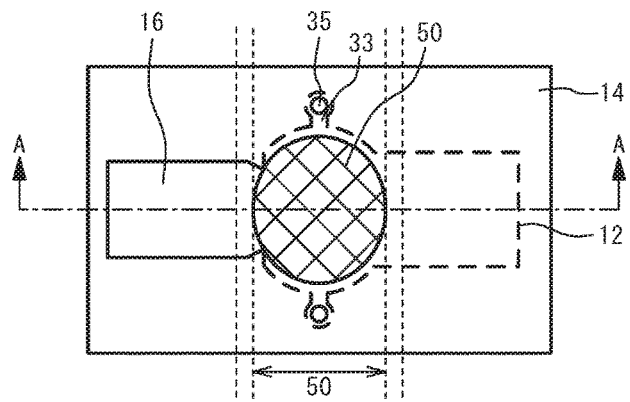
FIG. 1A is a plan view of a piezoelectric thin film resonator in accordance with a first embodiment.
Figure 1B:
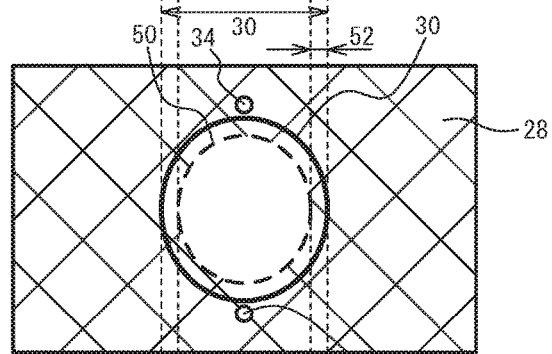
FIG. 1B is a plan view of an insertion film and an air gap.
Figure 1C:
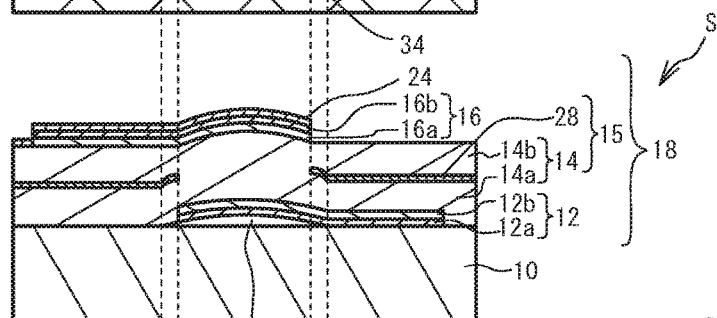
FIG. 1C and FIG. 1D are cross-sectional views taken along line A-A in FIG. 1A.
Figure 1D:
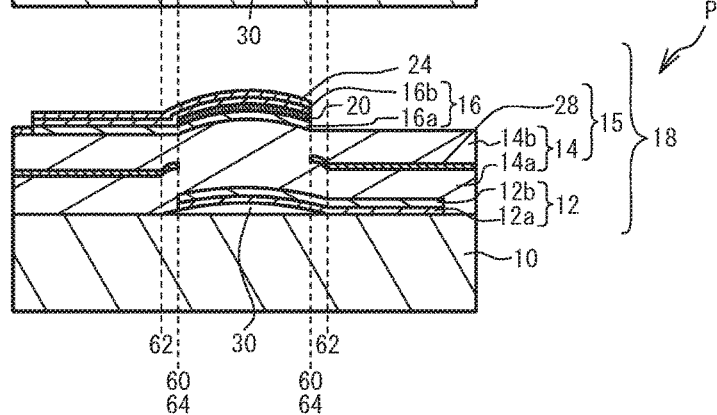

FIG. 1A is a plan view of a piezoelectric thin film resonator in accordance with a first embodiment, FIG. 1B is a plan view of an insertion film and an air gap, and FIG. 1C and FIG. 1D are cross-sectional views taken along line A-A in FIG. 1A. FIG. 1C illustrates a series resonator of, for example, a ladder-type filter, and FIG. 1D illustrates a parallel resonator of, for example, a ladder-type filter.

With reference to FIG. 1A and FIG. 1C, the structure of a series resonator S will be described. A lower electrode 12 is located on a substrate 10 that is a silicon (Si) substrate. An air gap 30 having a dome-shaped bulge is formed between the flat principal surface of the substrate 10 and the lower electrode 12. The dome-shaped bulge is a bulge having a shape in which the height of the air gap 30 is low in the periphery of the air gap 30 and increases at closer distances to the center of the air gap 30, for example. The lower electrode 12 includes a lower layer 12a and an upper layer 12b. The lower layer 12a is made of, for example, a chrome (Cr) film, and the upper layer 12b is made of, for example, a ruthenium (Ru) film.

Located on the lower electrode 12 is a piezoelectric film 14 mainly composed of aluminum nitride (AlN) having a main axis of (002) direction. The piezoelectric film 14 includes a lower piezoelectric film 14a and an upper piezoelectric film 14b. An insertion film 28 is located between the lower and upper piezoelectric films 14a and 14b. A multilayered film formed of the lower piezoelectric film 14a, the insertion film 28, and the upper piezoelectric film 14b that are stacked is a multilayered film 15.

An upper electrode 16 is located on the piezoelectric film 14 so as to have a region (a resonance region 50) where the upper electrode 16 faces the lower electrode 12 across the piezoelectric film 14. The resonance region 50 has an elliptical shape, and is a region where the acoustic wave in the thickness extension mode resonates. The upper electrode 16 includes a lower layer 16a and an upper layer 16b. The lower layer 16a is made of, for example, an Ru film, and the upper layer 16b is made of, for example, a Cr film.

A silicon oxide film as a frequency adjusting film 24 is located on the upper electrode 16. A multilayered film 18 in the resonance region 50 includes the lower electrode 12, the piezoelectric film 14, the upper electrode 16, and the frequency adjusting film 24. The frequency adjusting film 24 may function as a passivation film.

As illustrated in FIG. 1A, an introduction path 33 for etching a sacrifice layer is formed in the lower electrode 12. The sacrifice layer is a layer for forming the air gap 30. The vicinity of the tip of the introduction path 33 is not covered with the piezoelectric film 14, and the lower electrode 12 includes a hole portion 35 in the tip of the introduction path 33.

With reference to FIG. 1D, the structure of a parallel resonator P will be described. The parallel resonator P differs from the series resonator S in that a mass load film 20 made of a titanium (Ti) layer is located between the lower and upper layers 16a and 16b of the upper electrode 16. Thus, the multilayered film 18 includes the mass load film 20 formed across the entire surface in the resonance region 50 in addition to the multilayered film of the series resonator S. Other configurations are the same as those of the series resonator S illustrated in FIG. 1C, and thus the description is omitted.

The film thickness of the mass load film 20 is used to adjust the difference in resonant frequency between the series resonator S and the parallel resonator P. The resonant frequency of each of the series resonator S and the parallel resonator P is adjusted by adjusting the film thickness of the corresponding frequency adjusting film 24.

In the present embodiment, a piezoelectric thin film resonator with a resonant frequency of 2 GHz is configured as follows. The lower layer 12a of the lower electrode 12 is made of a Cr film with a film thickness of 100 nm, and the upper layer 12b is made of a Ru film with a film thickness of 200 nm. The piezoelectric film 14 is made of an AlN film with a film thickness of 1200 nm. The insertion film 28 is made of a silicon oxide ($SiO_2$) with a film thickness of 350 nm. The insertion film 28 is located in the middle of the piezoelectric film 14 in the film thickness direction. The lower layer 16a of the upper electrode 16 is made of a Ru film with a film thickness of 230 nm, and the upper layer 16b is made of a Cr film with a film thickness of 50 nm. The frequency adjusting film 24 is made of a silicon oxide film with a film thickness of 50 nm. The mass load film 20 is made of a Ti film with a film thickness of 120 nm. The film thickness of each layer can be appropriately configured so as to obtain desired resonance characteristics.

As illustrated in FIG. 1B, the air gap 30 includes the resonance region 50, and is larger than the resonance region 50. The insertion film 28 is not located in the resonance region 50, and is located to make contact with an outer outline 60 of the resonance region 50. The center region is a region within the resonance region 50, and is a region including the center of the resonance region 50. The center is not necessarily the geometric center. The insertion film 28 is continuously located to the outside of the air gap 30 in the outside of the resonance region 50. The insertion film 28 includes a hole portion 34 corresponding to the hole portion 35. In the region 52 that overlaps with the air gap 30 located outside the resonance region 50, the air gap 30 and the multilayered film 15 (i.e., the piezoelectric film 14 and the insertion film 28) are stacked.

As disclosed in Patent Document 2, the insertion film 28 preferably has a Young's modulus less than the Young's modulus of the piezoelectric film 14. When the insertion film 28 and the piezoelectric film 14 have approximately the same density, the insertion film 28 preferably has an acoustic impedance less than the acoustic impedance of the piezoelectric film 14 because a Young's modulus correlates with an acoustic impedance. This configuration improves the Q-value. In addition, when the insertion film 28 is made of a metal film, the effective electromechanical coupling coefficient is improved. Furthermore, to make the acoustic impedance of the insertion film 28 less than the acoustic impedance of the piezoelectric film 14, when the piezoelectric film 14 is mainly composed of aluminum nitride, the insertion film 28 is preferably made of an Al film, a gold (Au) film, a copper (Cu) film, a Ti film, a platinum (Pt) film, a tantalum (Ta) film, a Cr film, or a silicon oxide film. Especially, in the view point of the Young's modulus, the insertion film 28 is preferably an Al film or a silicon oxide film.

The substrate 10 may be, instead of a Si substrate, a quartz substrate, a glass substrate, a ceramic substrate, or a GaAs substrate. The lower electrode 12 and the upper electrode 16 may be made of, instead of Ru and Cr, a single-layer film of Al, Ti, Cu, molybdenum (Mo), tungsten (W), Ta, Pt, rhodium (Rh), or iridium (Ir), or a multilayered film of at least two of them. For example, the lower layer 16a of the upper electrode 16 may be made of Ru, and the upper layer 16b may be made of Mo.

The piezoelectric film 14 may be made of, instead of aluminum nitride, zinc oxide (ZnO), lead zirconate titanate (PZT), or lead titanate (PbTiO$_3$). Alternatively, for example, the piezoelectric film 14 may be mainly composed of aluminum nitride, and may contain other elements to improve the resonance characteristic or the piezoelectricity. For example, the use of scandium (Sc), a divalent element and a quadrivalent element, or a divalent element and a pentavalent element as an additive element improves the piezoelectricity of the piezoelectric film 14. Accordingly, the effective electromechanical coupling coefficient of the piezoelectric thin film resonator can be improved. The divalent element is, for example, calcium (Ca), magnesium (Mg), strontium (Sr), or zinc (Zn). The quadrivalent element is, for example, Ti, zirconium (Zr), or hafnium (Hf). The pentavalent element is, for example, Ta, niobium (Nb), or vanadium (V). Furthermore, the piezoelectric film 14 may be mainly composed of aluminum nitride, and may contain boron (B).

The frequency adjusting film 24 may be made of a silicon nitride film or an aluminum nitride instead of a silicon oxide film. The mass load film 20 may be made of a single-layer film of Ru, Cr, Al, Cu, Mo, W, Ta, Pt, Rh, or Ir instead of Ti. Alternatively, the mass load film 20 may be made of an insulating film made of, for example, metal nitride such as silicon nitride or metal oxide such as silicon oxide. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16 (between the lower layer 16a and the upper layer 16b). The mass load film 20 may be larger than the resonance region 50 as long as the mass load film 20 is formed so as to include the resonance region 50.

Figure 2A:
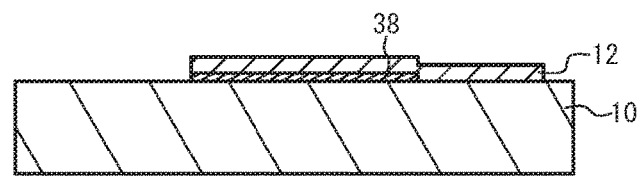
FIG. 2A through FIG. 2C are cross-sectional views illustrating a method of fabricating a series resonator of the first embodiment.
Figure 2B:
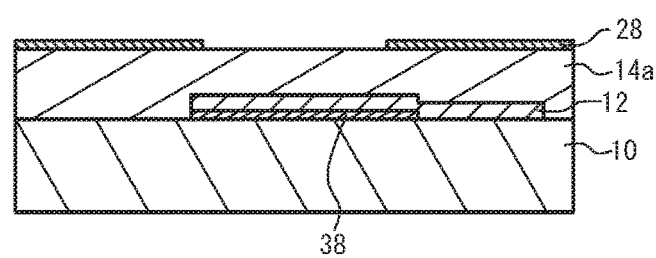
Figure 2C:
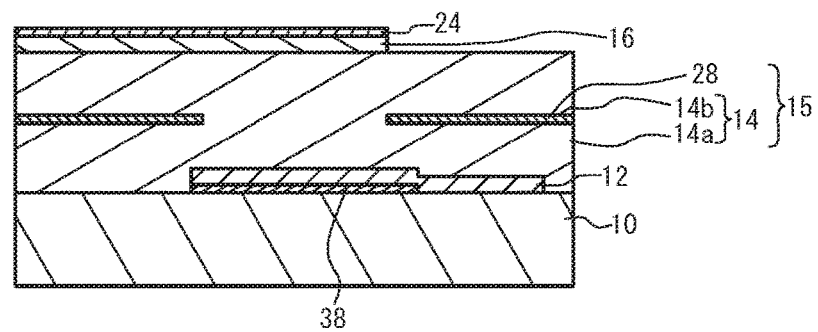

FIG. 2A through FIG. 2C are cross-sectional views illustrating a method of fabricating the series resonator of the first embodiment. As illustrated in FIG. 2A, a sacrifice layer 38 for forming an air gap is formed on the substrate 10 having a flat principal surface. The sacrifice layer 38 has a film thickness of, for example, 10 to 100 nm, and is made of a substance selected from substances such as magnesium oxide (MgO), ZnO, germanium (Ge), and silicon oxide (SiO$_2$) that easily dissolve in an etching liquid or an etching gas. Then, the sacrifice layer 38 is patterned into a desired shape by photolithography and etching. The shape of the sacrifice layer 38 corresponds to the planar shape of the air gap 30, and includes a region to be, for example, the resonance region 50. Then, the lower layer 12a and the upper layer 12b as the lower electrode 12 are formed on the sacrifice layer 38 and the substrate 10. The sacrifice layer 38 and the lower electrode 12 are formed by, for example, sputtering, vacuum evaporation, or Chemical Vapor Deposition (CVD). Then, the lower electrode 12 is patterned into a desired shape by photolithography and etching. The lower electrode 12 may be formed by liftoff.

As illustrated in FIG. 2B, the lower piezoelectric film 14a is formed on the lower electrode 12 and the substrate 10 by, for example, sputtering, vacuum evaporation, or CVD. The insertion film 28 is formed on the lower piezoelectric film 14a by, for example, sputtering, vacuum evaporation, or CVD. Then, the insertion film 28 is patterned into a desired shape by photolithography and etching. The insertion film 28 may be formed by liftoff.

As illustrated in FIG. 2C, the upper piezoelectric film 14b, and the lower and upper layers 16a and 16b of the upper electrode 16 are formed by, for example, sputtering, vacuum evaporation, or CVD. The lower and upper piezoelectric films 14a and 14b form the piezoelectric film 14. The upper electrode 16 is patterned into a desired shape by photolithography and etching. The upper electrode 16 may be formed by liftoff.

In the parallel resonator illustrated in FIG. 1D, after the lower layer 16a of the upper electrode 16 is formed, the mass load film 20 is formed by, for example, sputtering, vacuum evaporation, or CVD. The mass load film 20 is patterned into a desired shape by photolithography and etching. Then, the upper layer 16b of the upper electrode 16 is formed.

The frequency adjusting film 24 is formed by, for example, sputtering or CVD. The frequency adjusting film 24 is patterned into a desired shape by photolithography and etching.

Then, an etching liquid for etching the sacrifice layer 38 is introduced into the sacrifice layer 38 under the lower electrode 12 through the hole portion 35 and the introduction path 33 (see FIG. 1A). This process removes the sacrifice layer 38. A substance for etching the sacrifice layer 38 is preferably a substance that does not etch materials constituting the resonator except the sacrifice layer 38. Especially, a substance for etching is preferably a substance that does not etch the lower electrode 12 with which the substance for etching comes in contact. The stress on the multilayered film 18 (see FIG. 1C and FIG. 1D) is set so as to be a compression stress. This setting makes the multilayered film 18 bulge out toward the opposite side from the substrate 10 so as to separate from the substrate 10 when the sacrifice layer 38 is removed. The air gap 30 with a dome-shaped bulge is formed between the lower electrode 12 and the substrate 10. The above described process completes the series resonator S illustrated in FIG. 1A and FIG. 1C, and the parallel resonator P illustrated in FIG. 1A and FIG. 1D.

In the first embodiment, in the entire region surrounding the resonance region 50, an outer outline 62 that is the outer outline of the air gap 30 is located further out than the outer outline 60 of the resonance region 50. An inner outline 64 that is the inner outline of the multilayered film 15 substantially coincides with the outer outline 60 of the resonance region 50. Thus, the air gap 30 includes the resonance region 50 and is larger than the resonance region 50. A region 52 that is located further out than the outer outline 60 of the resonance region 50 and further in than the outer outline 62 of the air gap 30 completely surrounds the resonance region 50. The multilayered film 15 is formed in the whole of the region 52. As described above, the region 52 in which the air gap 30 and the multilayered film 15 overlap each other outside the resonance region 50 surrounds the whole circumference of the resonance region 50. The region 52 reflects or attenuates the acoustic wave leaking from the resonance region 50. Thus, the loss of the acoustic wave energy decreases, and the Q-value improves. Furthermore, the insertion film 28 is not located in the resonance region 50. Thus, the structure of the multilayered film 18 in the resonance region 50 is almost uniform. Accordingly, the electromechanical coupling coefficient can be improved.

Second Embodiment

Figure 3A:
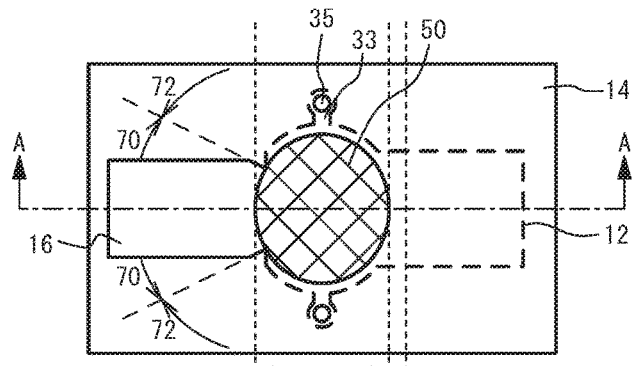
FIG. 3A is a plan view of a piezoelectric thin film resonator in accordance with a second embodiment.
Figure 3B:
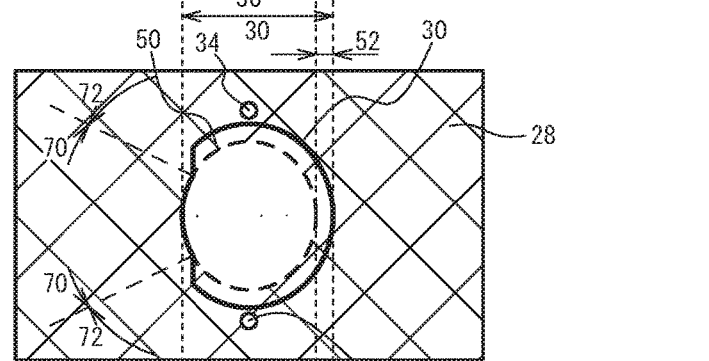
FIG. 3B is a plan view of an insertion film and an air gap.
Figure 3C:
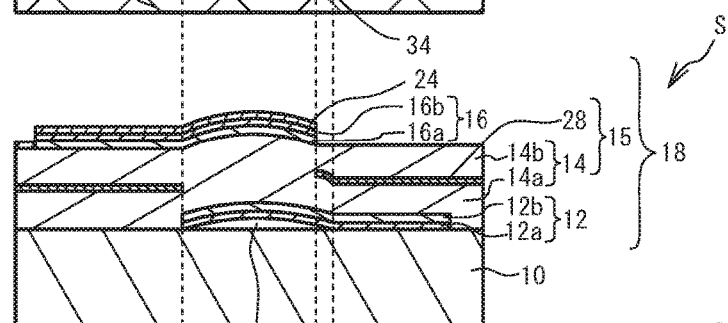
FIG. 3C and FIG. 3D are cross-sectional views taken along line A-A in FIG. 3A.
Figure 3D:
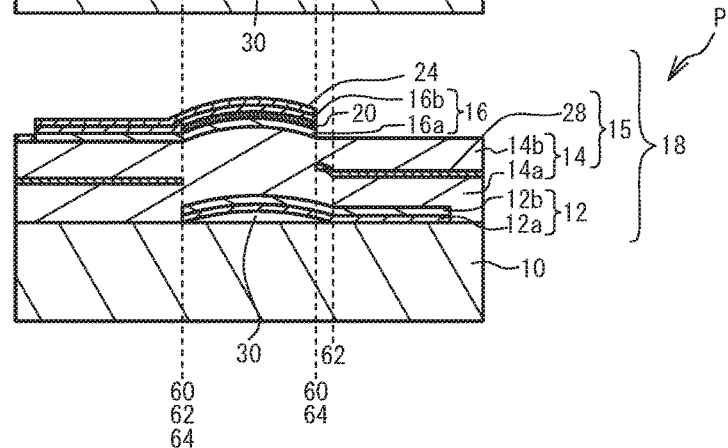

FIG. 3A is a plan view of a piezoelectric thin film resonator in accordance with a second embodiment, FIG. 3B is a plan view of an insertion film and an air gap, FIG. 3C and FIG. 3D are cross-sectional views taken along line A-A in FIG. 3A. FIG. 3C illustrates a series resonator of, for example, a ladder-type filter, and FIG. 3D illustrates a parallel resonator of, for example, a ladder-type filter.

As illustrated in FIG. 3A through FIG. 3D, the outer outline 62 of the air gap 30 substantially coincides with the outer outline 60 of the resonance region 50 in an extraction region 70, in which the upper electrode 16 is extracted from the resonance region 50, of a region surrounding the resonance region 50. That is, in the extraction region 70 of the upper electrode 16, the air gap 30 is not located outside the resonance region 50. The outer outline 62 of the air gap 30 is located further out than the outer outline 60 of the resonance region 50 in a region 72 that is a part of the region surrounding the resonance region 50 and other than the extraction region 70 of the upper electrode 16. That is, the air gap 30 is larger than the resonance region 50. Thus, the region 52 in which the air gap 30 and the multilayered film 15 overlap with each other in plan view is formed in the region 72. As in the second embodiment, the region 52 may be located so as to surround at least a part of the resonance region 50. Other configurations are the same as those of the first embodiment, and thus the description will be omitted.

Third Embodiment

Figure 4A:
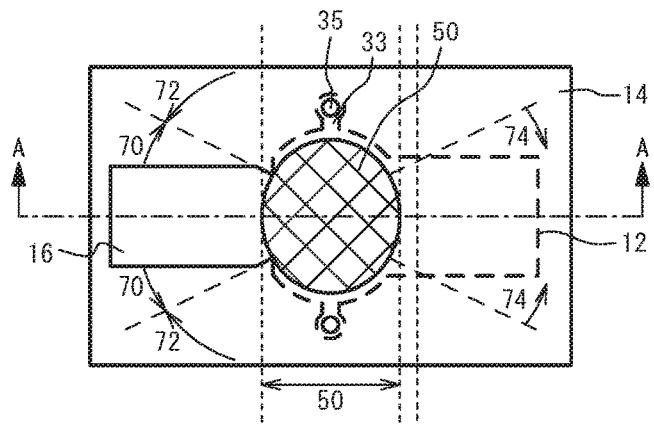
FIG. 4A is a plan view of a piezoelectric thin film resonator in accordance with a third embodiment.
Figure 4B:
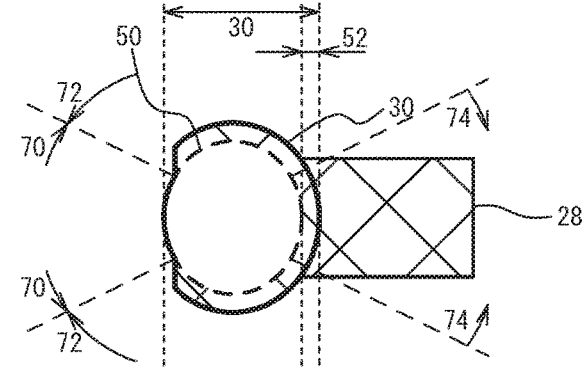
FIG. 4B is a plan view of an insertion film and an air gap.
Figure 4C:
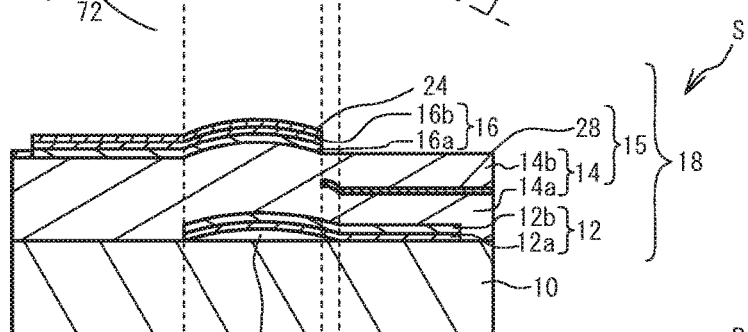
FIG. 4C and FIG. 4D are cross-sectional views taken along line A-A in FIG. 4A.
Figure 4D:
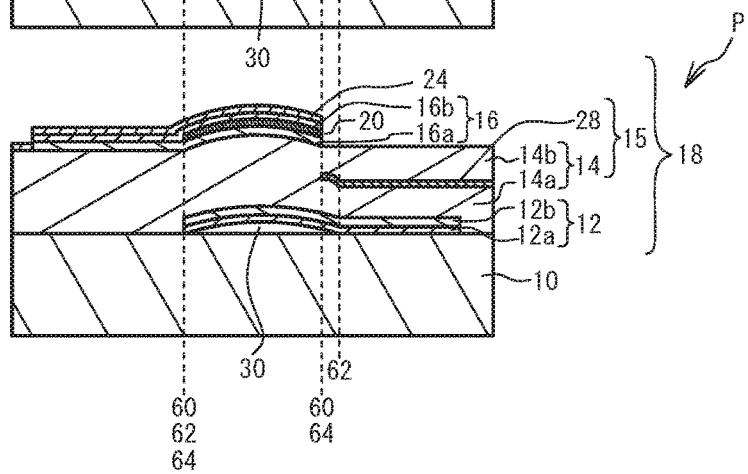

FIG. 4A is a plan view of a piezoelectric thin film resonator in accordance with a third embodiment, FIG. 4B is a plan view of an insertion film and an air gap, and FIG. 4C and FIG. 4D are cross-sectional views taken along line A-A in FIG. 4A. FIG. 4C illustrates a series resonator of, for example, a ladder-type filter, and FIG. 4D illustrates a parallel resonator of, for example, a ladder-type filter.

As illustrated in FIG. 4A through FIG. 4D, the insertion film 28 is not formed in the extraction region 70 of the upper electrode 16, which is a part of the region surrounding the resonance region 50. In a region that is a part of the region surrounding the resonance region 50, is other than the extraction region 72 of the upper electrode 16, and is other than an extraction region 74 of the lower electrode 12, the outer outline 62 of the air gap 30 substantially coincides with the outer outline of the multilayered film 15. In the extraction region 74 of the lower electrode 12, the outer outline of the multilayered film 15 is located further out than the outer outline 62 of the air gap 30. As in the third embodiment, the multilayered film 15 may not be necessarily located outside the region 52. When the region 52 completely surrounds the resonance region 50 as in the first embodiment, the multilayered film 15 may not be necessarily located outside the region 52. Other configurations are the same as those of the second embodiment, and thus the description is omitted.

Fourth Embodiment

Figure 5A:
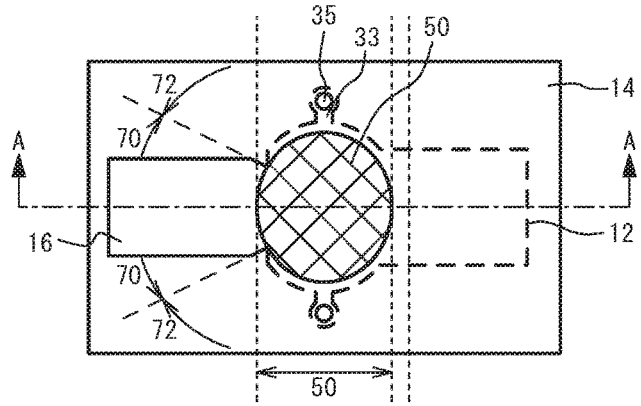
FIG. 5A is a plan view of a piezoelectric thin film resonator in accordance with a fourth embodiment.
Figure 5B:
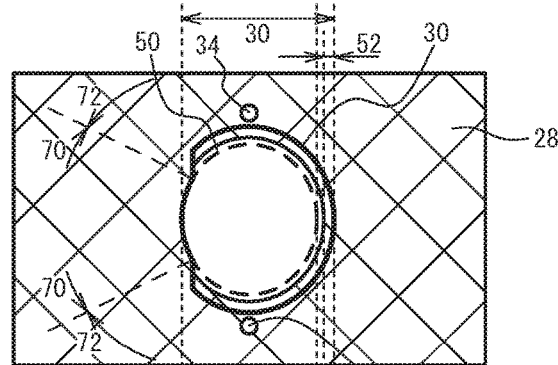
FIG. 5B is a plan view of an insertion film and an air gap.
Figure 5C:
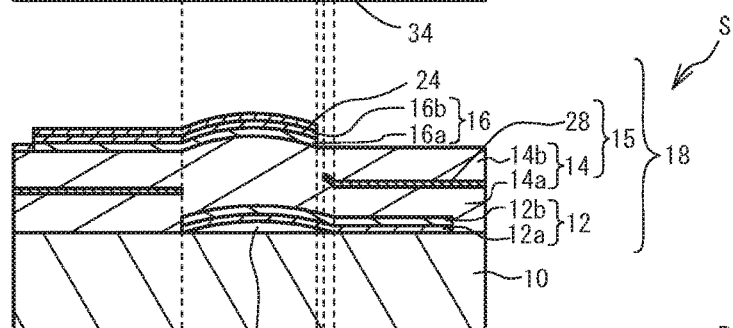
FIG. 5C and FIG. 5D are cross-sectional views taken along line A-A in FIG. 5A.
Figure 5D:
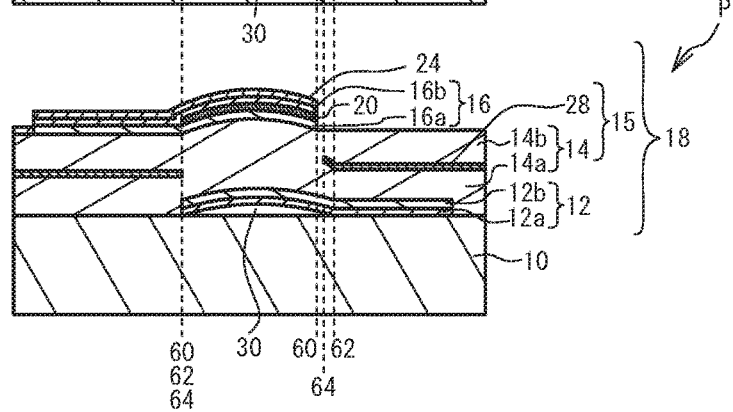

FIG. 5A is a plan view of a piezoelectric thin film resonator in accordance with a fourth embodiment, FIG. 5B is a plan view of an insertion film and an air gap, and FIG. 5C and FIG. 5D are cross-sectional views taken along line A-A in FIG. 5A. FIG. 5C illustrates a series resonator of, for example, a ladder-type filter, and FIG. 5D illustrates a parallel resonator of, for example, a ladder-type filter.

As illustrated in FIG. 5A through FIG. 5D, in the extraction region 70 of the upper electrode 16, the inner outline 64 of the multilayered film 15 substantially coincides with the outer outline 60 of the resonance region 50 and the outer outline 62 of the air gap 30. In the region 72 that is a part of the region surrounding the resonance region 50 and other than the region 70, the inner outline 64 of the multilayered film 15 is located further out than the outer outline 60 of the resonance region 50. As in the fourth embodiment, the inner outline 64 of the multilayered film 15 may be located further out than the outer outline 60 of the resonance region 50. When the region 52 completely surrounds the resonance region 50 as in the first embodiment, at least a part of the inner outline 64 of the multilayered film 15 may be located further out than the outer outline 60 of the resonance region 50.

Fifth Embodiment

Figure 6A:
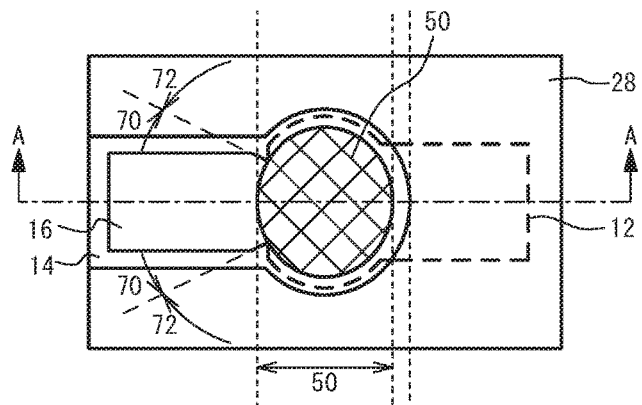
FIG. 6A is a plan view of a piezoelectric thin film resonator in accordance with a fifth embodiment.
Figure 6B:
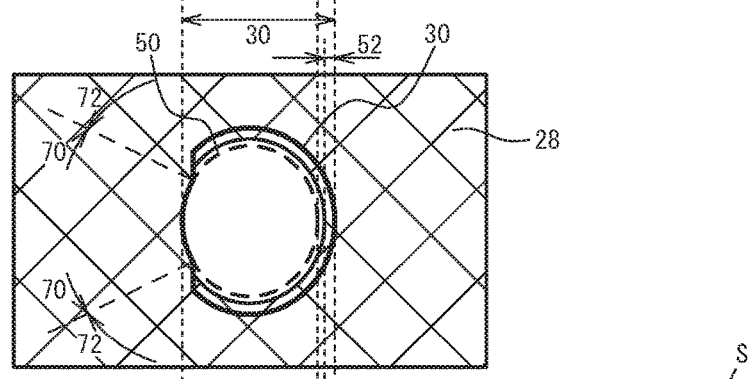
FIG. 6B is a plan view of an insertion film and an air gap.
Figure 6C:
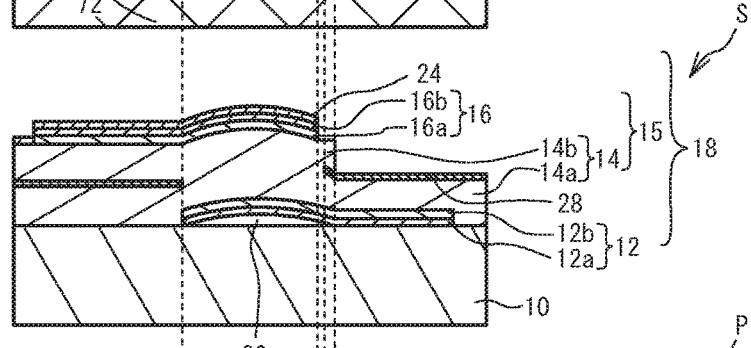
FIG. 6C and FIG. 6D are cross-sectional views taken along line A-A in FIG. 6A.
Figure 6D:
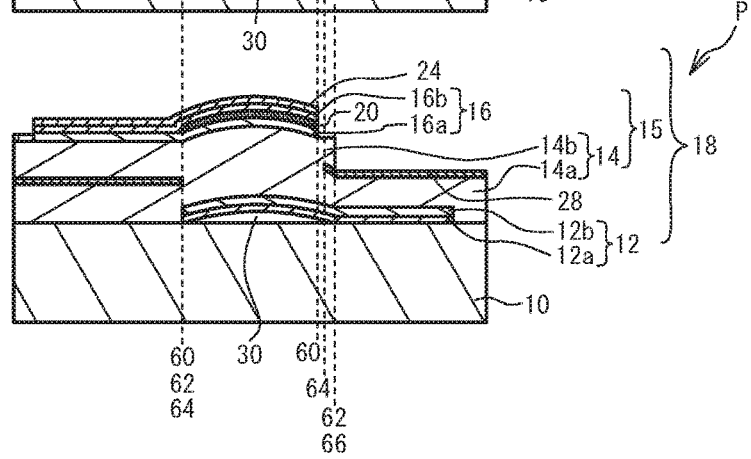

FIG. 6A is a plan view of a piezoelectric thin film resonator in accordance with a fifth embodiment, FIG. 6B is a plan view of an insertion film and an air gap, and FIG. 6C and FIG. 6D are cross-sectional views taken along line A-A in FIG. 6A. FIG. 6C illustrates a series resonator of, for example, a ladder-type filter, and FIG. 6D illustrates a parallel resonator of, for example, a ladder-type filter.

As illustrated in FIG. 6A through FIG. 6D, the outer outline 62 of the air gap 30 substantially coincides with an outer outline 66 of the upper piezoelectric film 14b in the region 72 that is a part of the region surrounding the resonance region 50 and other than the extraction region 70 of the upper electrode 16. As in the fifth embodiment, the upper piezoelectric film 14b located outside the region 52 may be removed. The outer outline 62 of the air gap 30 may not necessarily coincide with the outer outline 66 of the upper piezoelectric film 14b. When the outer outline 60 of the resonance region 50 substantially coincides with the inner outline 64 of the multilayered film 15 as in the first and second embodiments, the upper piezoelectric film 14b outside the region 52 may be removed. Other configurations are the same as those of the fourth embodiment, and thus the description is omitted.

Sixth Embodiment

FIG. 7A is a plan view of a piezoelectric thin film resonator in accordance with a sixth embodiment, FIG. 7B is a plan view of an insertion film and an air gap, and FIG. 7C and FIG. 7D are cross-sectional views taken along line A-A in FIG. 7A. FIG. 7C illustrates a series resonator of, for example, a ladder-type filter, and FIG. 7D illustrates a parallel resonator of, for example, a ladder-type filter.

As illustrated in FIG. 7A through FIG. 7D, the outer outline 62 of the air gap 30 substantially coincides with an outer outline 68 of the piezoelectric film 14 in the region 72 that is a part of the region surrounding the resonance region 50 and other than the extraction region 70 of the upper electrode 16. As in the sixth embodiment, the piezoelectric film 14 located outside the region 52 may be removed. The outer outline 62 of the air gap 30 may not necessarily coincide with the outer outline 68 of the piezoelectric film 14. When the outer outline 60 of the resonance region 50 substantially coincides with the inner outline 64 of the multilayered film 15 as in the first and second embodiments, the piezoelectric film 14 located outside the region 52 may be removed. Other configurations are the same as those of the fourth embodiment, and thus the description is omitted.

Seventh Embodiment

Figure 8A:
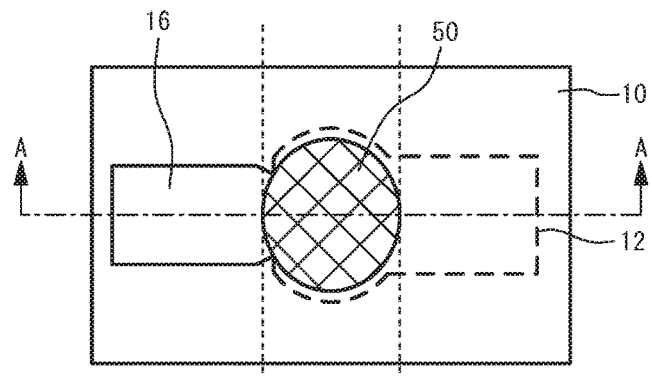
FIG. 8A is a plan view of a piezoelectric thin film resonator in accordance with a seventh embodiment.
Figure 8B:
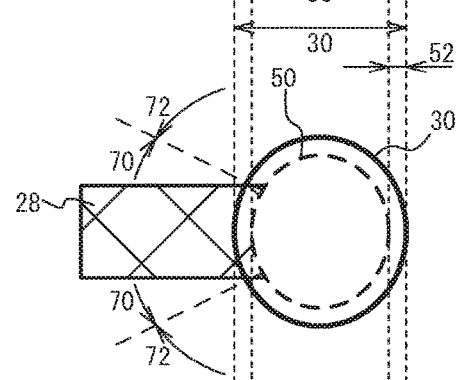
FIG. 8B is a plan view of an insertion film and an air gap.
Figure 8C:
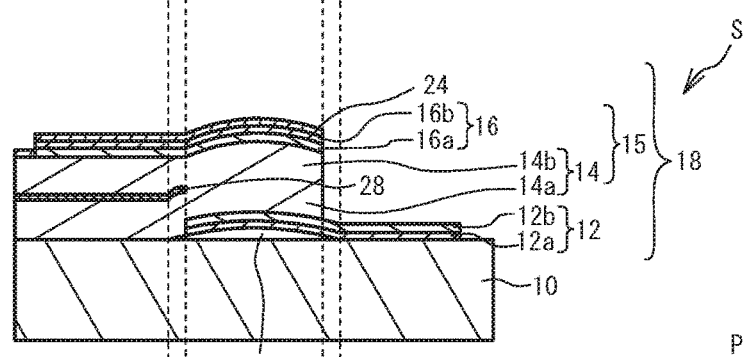
FIG. 8C and FIG. 8D are cross-sectional views taken along line A-A in FIG. 8A.
Figure 8D:
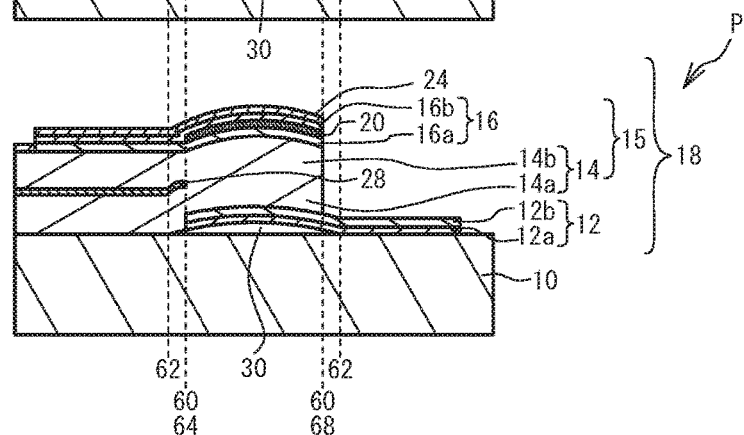

FIG. 8A is a plan view of a piezoelectric thin film resonator in accordance with a seventh embodiment, FIG. 8B is a plan view of an insertion film and an air gap, and FIG. 8C and FIG. 8D are cross-sectional views taken along line A-A in FIG. 8A. FIG. 8C illustrates a series resonator of, for example, a ladder-type filter, and FIG. 8D illustrates a parallel resonator of, for example, a ladder-type filter.

As illustrated in FIG. 8A through FIG. 8D, the outer outline 60 of the resonance region 50 substantially coincides with the outer outline 68 of the piezoelectric film 14 in the region 72 that is a part of the region surrounding the resonance region 50 and other than the extraction region 70 of the upper electrode 16. As described above, the piezoelectric film 14 and the insertion film 28 located outside the resonance region 50 may be removed in the region 72. Other configurations are the same as those of the first embodiment, and thus the description is omitted.

The leak of the acoustic wave energy to the outside of the resonance region 50 in the extraction region 70 of the upper electrode 16 is reduced with the region 52 including the insertion film 28, and the leak of the acoustic wave in the region 72 is reduced by removing the piezoelectric film 14. Accordingly, the leak of the acoustic wave energy from the region surrounding the resonance region 50 can be reduced. In the region 72, the outer outline 60 of the piezoelectric film 14 may be located further in than the outer outline of the upper electrode 16.

Eighth Embodiment

Figure 9A:
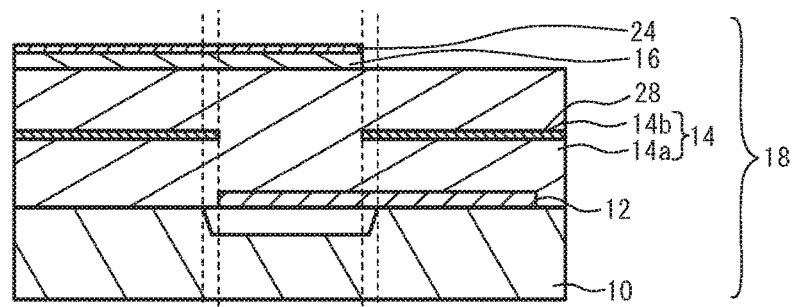
FIG. 9A is a cross-sectional view of a piezoelectric thin film resonator in accordance with an eighth embodiment.
Figure 9B:
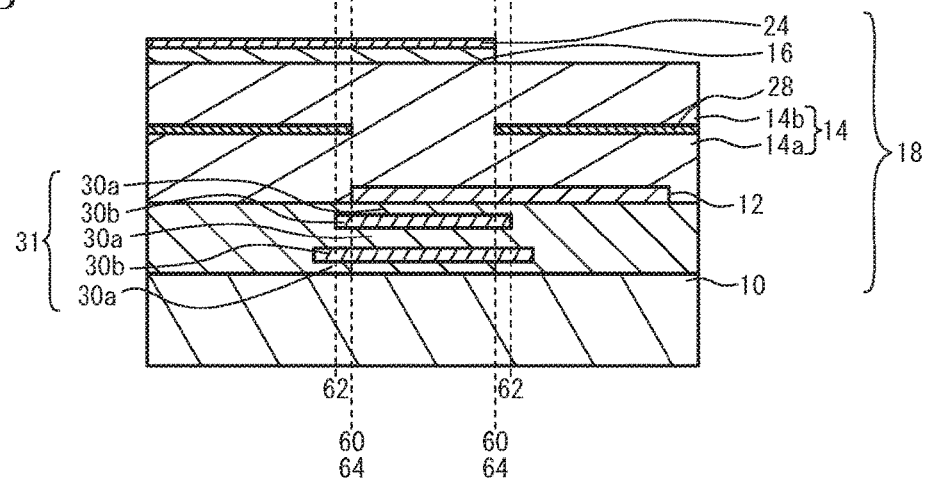
FIG. 9B is a cross-sectional view of a piezoelectric thin film resonator in accordance with a first variation of the eighth embodiment.

An eighth embodiment and a variation thereof changes the structure of the air gap. FIG. 9A is a cross-sectional view of a piezoelectric thin film resonator in accordance with the eighth embodiment, and FIG. 9B is a cross-sectional view of a piezoelectric thin film resonator in accordance with a first variation of the eighth embodiment. As illustrated in FIG. 9A, a recessed portion is formed in the upper surface of the substrate 10. The lower electrode 12 is flatly formed on the substrate 10. Accordingly, the air gap 30 is formed in the recessed portion of the substrate 10. The air gap 30 is formed so as to include the resonance region 50. Other configurations are the same as those of the first embodiment, and thus the description is omitted. The air gap 30 may be formed so as to penetrate through the substrate 10. An insulating film may be formed so as to make contact with the lower surface of the lower electrode 12. That is, the air gap 30 may be formed between the substrate 10 and an insulating film making contact with the lower electrode 12. The insulating film may be made of, for example, an aluminum nitride film.

As illustrated in FIG. 9B, an acoustic mirror 31 may be formed under the lower electrode 12 in the resonance region 50. The acoustic mirror 31 includes a film 30a with a low acoustic impedance and a film 30b with a high acoustic impedance that are alternately stacked. Each of the films 30a and 30b has a film thickness of, for example, $\lambda/4$ ($\lambda$ is the wavelength of the acoustic wave). The stacking number of the films 30a and 30b may be freely selected. For example, the acoustic mirror 31 may have a structure in which a single film with an acoustic impedance different from the acoustic impedance of the substrate 10 is located in the substrate 10. Other configurations are the same as those of the first embodiment, and thus the description is omitted.

In the first through seventh embodiments, the air gap 30 may be formed as described in the eighth embodiment, or the acoustic mirror 31 may be formed instead of the air gap 30 as in the first variation of the eighth embodiment.

As in the first through eighth embodiments, the piezoelectric thin film resonator may be a Film Bulk Acoustic Resonator (FBAR) in which the air gap 30 is formed between the substrate 10 and the lower electrode 12 in the resonance region 50. Alternatively, as in the first variation of the eighth embodiment, the piezoelectric thin film resonator may be a Solidly Mounted Resonator (SMR) including the acoustic mirror 31, which reflects the acoustic wave propagating through the piezoelectric film 14, under the lower electrode 12 in the resonance region 50.

In the first through eighth embodiments and the variation thereof, the resonance region 50 has an elliptical shape, but may have other shapes. For example, the resonance region 50 may have a polygonal shape such as a quadrangle shape or a pentagonal shape.

Figure 10A:
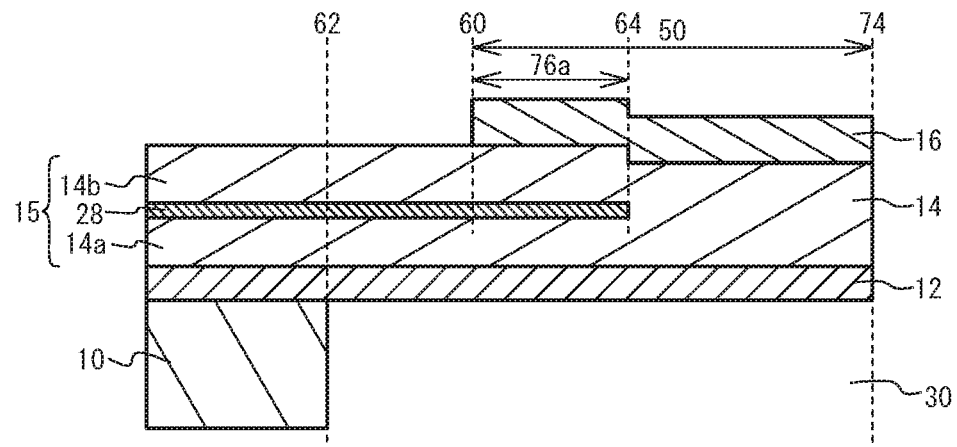
FIG. 10A through FIG. 10C are cross-sectional views of piezoelectric thin film resonators in accordance with first through third comparative examples used for a simulation.
Figure 10B:
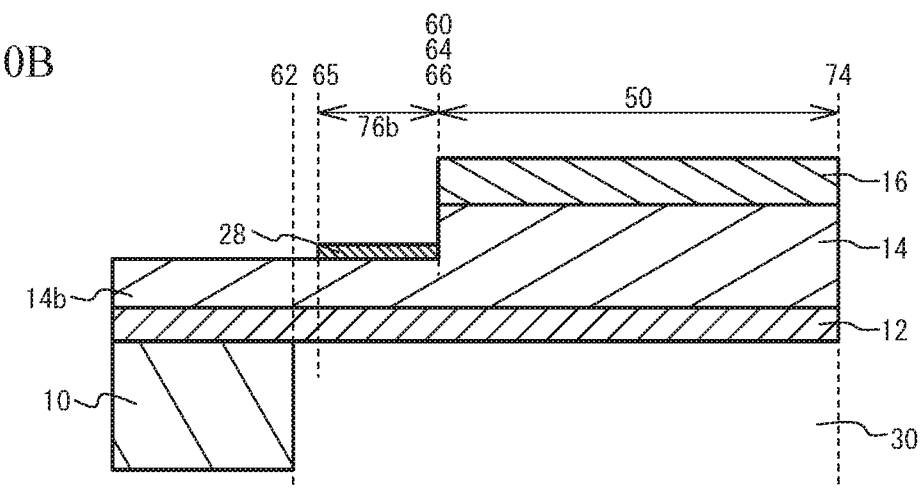
Figure 10C:
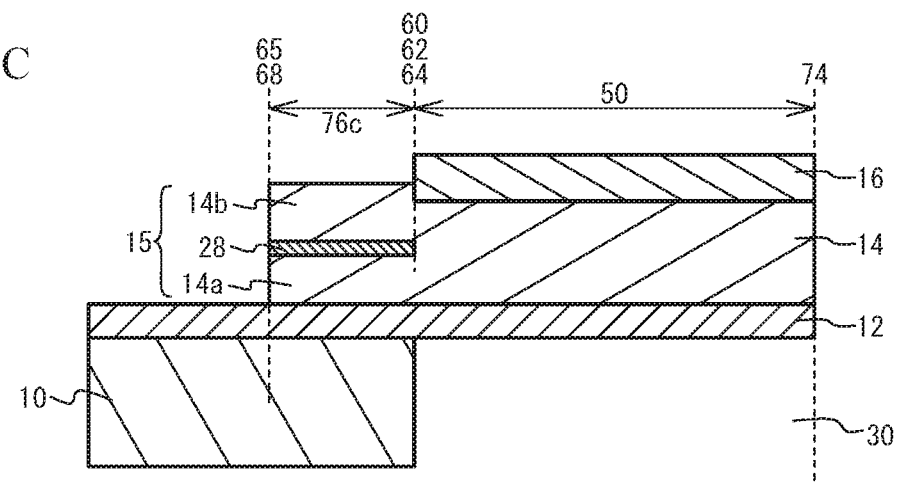

In the first through eighth embodiments, the effect of the region 52 on the resonance characteristic was simulated with a two-dimensional finite element method. The materials and the film thicknesses used for the simulation are as follows.
Lower electrode 12: Cr film with a film thickness of 0.1 μm, Ru film with a film thickness of 0.2 μm on the Cr film
Piezoelectric film 14: AlN film with a film thickness of 1.26 μm
Lower piezoelectric film 14a: AlN film with a film thickness of 0.63 μm
Upper piezoelectric film 14b: AlN film with a film thickness of 0.63 μm
Insertion film 28: silicon oxide film with a film thickness of 0.35 μm
Upper electrode 16: Ru film with a film thickness of 0.23 μm FIG. 10A through FIG. 10C are cross-sectional views of piezoelectric thin film resonators in accordance with first through third comparative examples used for the simulation. As illustrated in FIG. 10A, in the first comparative example, the outer outline 62 of the air gap 30 is located further out than the outer outline 60 of the resonance region 50. The inner outline 64 of the multilayered film 15 is located further in than the outer outline 60 of the resonance region 50. In the first comparative example, the multilayered film 15 is located in an outer peripheral region 76a within the resonance region 50.

As illustrated in FIG. 10B, in the second comparative example, the insertion film 28 is located in a region 76b surrounding the resonance region 50. The inner outline 64 of the multilayered film 15 and the outer outline 66 of the upper piezoelectric film 14b substantially coincide with the outer outline 60 of the resonance region 50. In the second comparative example, the insertion film 28 is located in the region 76b located outside the resonance region 50 and is not located in the resonance region 50. The upper piezoelectric film 14b is not located outside the resonance region 50. Accordingly, the multilayered film 15 is not located in the region 76b.

As illustrated in FIG. 10C, in the third comparative example, the multilayered film 15 is located in a region 76c surrounding the resonance region 50. The outer outline 62 of the air gap 30 substantially coincides with the outer outline 60 of the resonance region 50 and the inner outline 64 of the multilayered film 15. In the third comparative example, the multilayered film 15 is located in the region 76c outside the resonance region 50, and the air gap 30 is not located in the region 76c outside the resonance region 50.

Figure 11A:
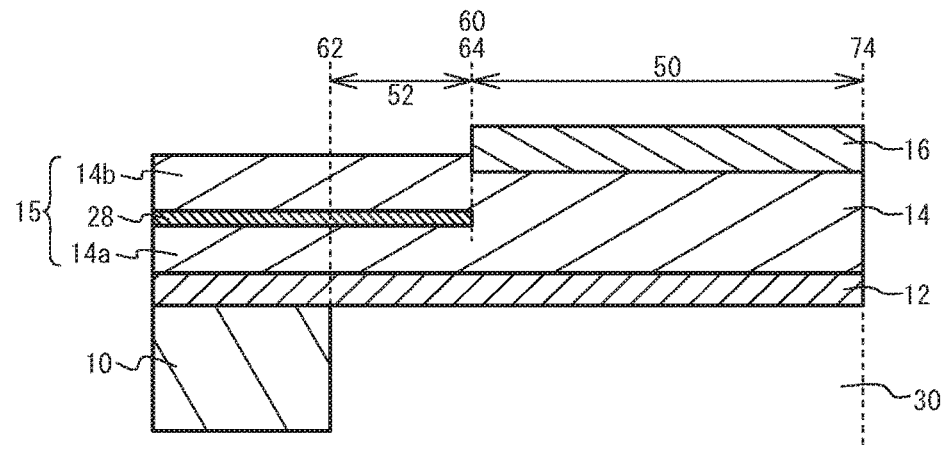
FIG. 11A through FIG. 11C are cross-sectional views of piezoelectric thin film resonators in accordance with first through third variations of the first embodiment used for the simulation.
Figure 11B:
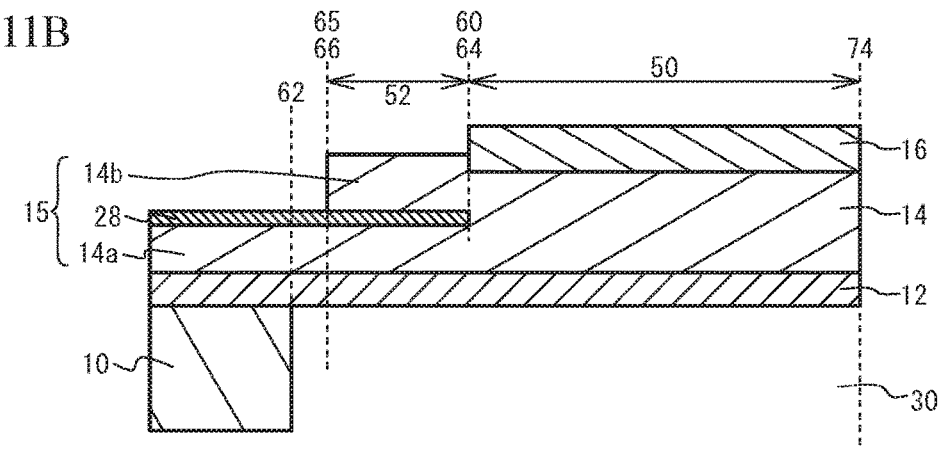
Figure 11C:
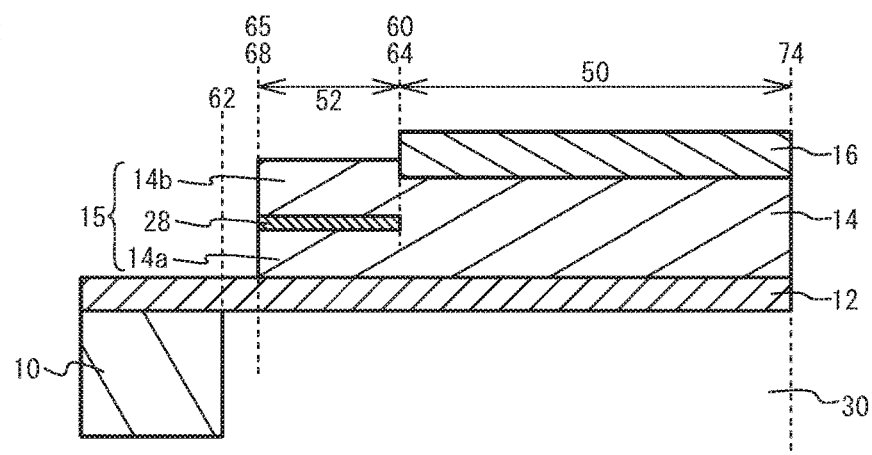

FIG. 11A through FIG. 11C are cross-sectional views of piezoelectric thin film resonators in accordance with first through third variations of the first embodiment used for the simulation. As illustrated in FIG. 11A, in the first variation of the first embodiment, the outer outline 60 of the resonance region 50 substantially coincides with the inner outline 64 of the multilayered film 15. The multilayered film 15 extends further out than the outer outline 62 of the air gap 30.

As illustrated in FIG. 11B, in the second variation of the first embodiment, the outer outline 66 of the upper piezoelectric film 14b (i.e., an outer outline 65 of the multilayered film 15) is located further out than the outer outline 60 of the resonance region 50 and further in than the outer outline 62 of the air gap 30. The insertion film 28 and the lower piezoelectric film 14a extend further out than the outer outline 62 of the air gap 30.

As illustrated in FIG. 11C, in the third variation of the first embodiment, the outer outline 68 of the piezoelectric film 14 (i.e., the outer outline 65 of the multilayered film 15) is located further out than the outer outline 60 of the resonance region 50 and further in than the outer outline 62 of the air gap 30.

The regions 52, 76a, 76b, and 76c were configured to have widths of 1.5 μm, the resonance region 50 was configured to have a width of 42 μm, and the boundary condition of the center (a line 78) of the resonance region 50 was configured to be a mirror condition to conduct the simulation.

FIG. 12 illustrates a Q-value Qa at the antiresonant frequency and an electromechanical coupling coefficient $k^2$ in the first through third comparative examples and the first through third variations of the first embodiment. As illustrated in FIG. 12, the Q-value Qa at the antiresonant frequency and the electromechanical coupling coefficient $k^2$ when the region 52 in which the multilayered film 15 and the air gap 30 overlap with each other is provided outside the resonance region 50 are greater than the Q-value Qa and the electromechanical coupling coefficient $k^2$ in the first comparative example that provides the multilayered film 15 in the outer peripheral region 76a within the resonance region 50. Even though the insertion film 28 overlapping with the air gap 30 is located outside the resonance region 50 as in the second comparative example, neither the Q-value at the antiresonant frequency nor the electromechanical coupling coefficient $k^2$ improves. When the multilayered film 15 is located outside the resonance region 50 but does not overlap with the air gap 30 as in the third comparative example, neither the Q-value at the antiresonant frequency nor the electromechanical coupling coefficient $k^2$ improves. When the multilayered film 15 at least partially overlaps with the air gap 30 in the outside of the resonance region 50 as in the first through third variations of the first embodiment, the Q-value at the antiresonant frequency and the electromechanical coupling coefficient $k^2$ improve. This is considered to be because the acoustic wave propagating from the resonance region 50 is reflected or attenuated in the region 52 where the multilayered film 15 and the air gap 30 overlap each other, and the leak of the acoustic wave energy to the outside of the resonance region 50 is reduced.

As described above, the first through eighth embodiments provide, under the lower electrode 12, the air gap 30 that includes the resonance region 50 and is larger than the resonance region 50. The multilayered film 15 is located in at least a part of a region that is located further out than the outer outline 60 of the resonance region 50 and further in than the outer outline 62 of the air gap 30 and surrounds the resonance region 50. In the region 52 where the multilayered film 15 overlaps with the air gap 30 outside the resonance region 50, the acoustic wave is reflected or attenuated. Accordingly, the leak of the acoustic energy from the resonance region 50 can be reduced. Therefore, the characteristics including the Q-value can be improved.

In addition, the multilayered film 15 is not located in the resonance region 50. Thus, the multilayer structure in the resonance region 50 is almost uniform. Accordingly, the electromechanical coupling coefficient can be improved. The multilayered film 15 may be located in the resonance region 50 to the extent that the multilayered film 15 hardly affects the characteristics. When the inner outline 64 of the multilayered film 15 is located further in than the outer outline 60 of the resonance region 50, the distance between the inner outline 64 and the outer outline 60 is preferably equal to or less than a quarter of the wavelength of the acoustic wave propagating through the piezoelectric film 14 in the lateral direction from the resonance region 50 to the outside of the resonance region 50.

To efficiently reflect the acoustic wave propagating through the piezoelectric film 14 in the lateral direction, the region 52 preferably has a width equal to or greater than a quarter of the wavelength of the acoustic wave propagating in the lateral direction. In addition, the width of the region 52 is configured to be approximately equal to an odd multiple of a quarter of the wavelength of the acoustic wave propagating in the lateral direction. This configuration increases the reflection of the acoustic wave in the region 52. Accordingly, the leak of the acoustic wave energy from the resonance region 50 can be efficiently reduced.

Furthermore, in at least a part of the region surrounding the resonance region 50, the inner outline 64 of the multilayered film 15 substantially coincides with the outer outline 60 of the resonance region 50. Since the multilayered film 15 is not located in the resonance region 50, the electromechanical coupling coefficient can be improved, and since the multilayered film 15 is not located away from the resonance region 50, the leak of the acoustic wave energy from the resonance region 50 can be efficiently reduced.

In at least a part of the region surrounding the resonance region 50, the inner outline 64 of the multilayered film 15 may be located further out than the outer outline 60 of the resonance region 50. To efficiently reduce the leak of the acoustic wave energy from the resonance region 50, the distance between the inner outline 64 of the multilayered film 15 and the outer outline 60 of the resonance region 50 is preferably equal to or less than the wavelength of the acoustic wave propagating through the piezoelectric film 14 in the lateral direction, more preferably equal to or less than a quarter of the wavelength.

In at least a part of the region surrounding the resonance region 50, the inner outline 64 of the multilayered film 15 may substantially coincide with the outer outline 62 of the air gap 30, may be located further in than the outer outline 62, or may be located further out than the outer outline 62.

In at least a part of the region surrounding the resonance region 50, the piezoelectric film 14 outside the air gap 30 may be removed. This configuration further reduces the leak of the acoustic wave energy.

The air gap 30 may be an air space containing the air. The air space can efficiently reflect the acoustic wave propagating through the piezoelectric film 14 in the longitudinal direction.

The air gap 30 in the first through eighth embodiments may be replaced by the acoustic mirror 31 of the variation of the eighth embodiment. The acoustic mirror 31 can efficiently reflect the acoustic wave propagating through the piezoelectric film 14.

Ninth Embodiment

Figure 13A:
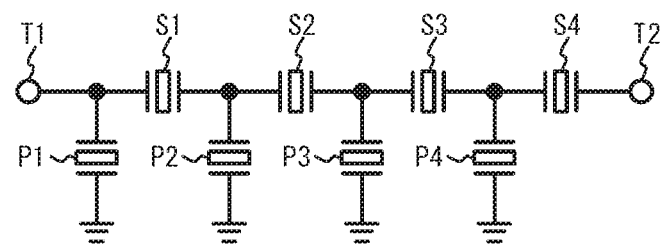
FIG. 13A is a circuit diagram of a filter in accordance with a ninth embodiment.

A ninth embodiment is an exemplary filter and an exemplary duplexer using the piezoelectric thin film resonator in accordance with any one of the first through eighth embodiments and the variations thereof. FIG. 13A is a circuit diagram of a filter in accordance with the ninth embodiment. As illustrated in FIG. 13A, one or more series resonators S1 through S4 are connected in series between an input terminal T1 and an output terminal T2. One or more parallel resonators P1 through P4 are connected in parallel between the input terminal T1 and the output terminal T2. At least one of one or more series resonators S1 through S4 and one or more parallel resonators P1 through P4 may be the acoustic wave resonator in accordance with any one of the first through eighth embodiments and the variations thereof. The filter including the acoustic wave resonator of any one of the first through eighth embodiments and the variations thereof may be a multi-mode filter instead of a ladder-type filter.

Figure 13B:
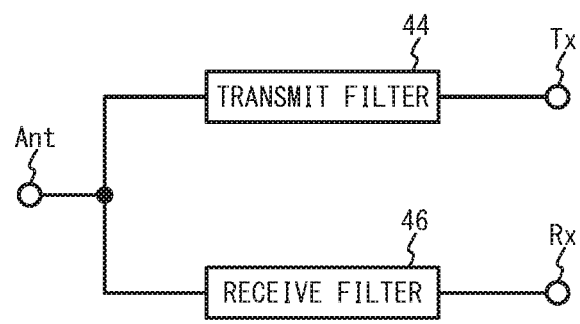
FIG. 13B is a circuit diagram of a duplexer in accordance with a variation of the ninth embodiment.

FIG. 13B is a circuit diagram of a duplexer in accordance with a variation of the ninth embodiment. As illustrated in FIG. 13B, a transmit filter 44 is connected between a common terminal Ant and a transmit terminal Tx. A receive filter 46 is connected between the common terminal Ant and a receive terminal Rx. The transmit filter 44 transmits, among signals input from the transmit terminal Tx, signals in the transmit band to the common terminal Ant as transmission signals, and suppresses signals with other frequencies. The receive filter 46 transmits, among signals input from the common terminal Ant, signals in the receive band to the receive terminal Rx as reception signals, and suppresses signals with other frequencies. At least one of the transmit filter 44 and the receive filter 46 may be the filter of the ninth embodiment.

The filter includes the piezoelectric thin film resonator in accordance with any one of the first through eighth embodiments and the variations thereof. Thus, the Q-value of the resonator improves, and the skirt characteristic of the filter improves.

In addition, at least one of the transmit filter 44 and the receive filter 46 can be a filter including the piezoelectric thin film resonator in accordance with any one of the first through eighth embodiments and the variations thereof.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a piezoelectric film that is located on the substrate, and is formed of a lower piezoelectric film and an upper piezoelectric film that are stacked;
   a lower electrode and an upper electrode that face each other across at least a part of the piezoelectric film; and
   an insertion film that is inserted between the lower piezoelectric film and the upper piezoelectric film,
   wherein an air gap or an acoustic mirror that includes a resonance region defined by a region where the lower electrode and the upper electrode face each other across the piezoelectric film and that is larger than the resonance region in plan view is located under the lower electrode, and
   a multilayered film formed of the lower piezoelectric film, the insertion film, and the upper piezoelectric film that are stacked is located in at least a part of a region that is located further out than an outer outline of the resonance region, further in than an outer outline of the air gap or an outer outline of the acoustic mirror, and surrounds the resonance region, and
   the multilayered film is not located in the resonance region.

2. The piezoelectric thin film resonator according to claim 1, wherein
   in at least a part of the region surrounding the resonance region, an inner outline of the multilayered film substantially coincides with the outer outline of the resonance region.

3. The piezoelectric thin film resonator according to claim 1, wherein
   in at least a part of the region surrounding the resonance region, an inner outline of the multilayered film is located further out than the outer outline of the resonance region.

4. The piezoelectric thin film resonator according to claim 1, wherein
   in at least a part of the region surrounding the resonance region, an outer outline of the multilayered film is located further out than the outer outline of the air gap or the outer outline of the acoustic mirror.

5. The piezoelectric thin film resonator according to claim 1, wherein
   in at least a part of the region surrounding the resonance region, the piezoelectric film outside the air gap or the acoustic mirror is removed.

6. The piezoelectric thin film resonator according to claim 1, wherein
   the insertion film has an acoustic impedance less than an acoustic impedance of the piezoelectric film.

7. The piezoelectric thin film resonator according to claim 1, wherein
   the air gap or the acoustic mirror is an air space.

8. The piezoelectric thin film resonator according to claim 1, wherein
   the air gap or the acoustic mirror is an acoustic mirror that reflects an acoustic wave propagating through the piezoelectric film.

9. A piezoelectric thin film resonator comprising:
   a substrate;
   a piezoelectric film that is located on the substrate, and is formed of a lower piezoelectric film and an upper piezoelectric film that are stacked;
   a lower electrode and an upper electrode that face each other across at least a part of the piezoelectric film; and
   an insertion film that is inserted between the lower piezoelectric film and the upper piezoelectric film,
   wherein an air gap or an acoustic mirror that includes a resonance region defined by a region where the lower electrode and the upper electrode face each other across the piezoelectric film and that is larger than the resonance region in plan view is located under the lower electrode, and
   a multilayered film formed of the lower piezoelectric film, the insertion film, and the upper piezoelectric film that are stacked is located in at least a part of a region that is located further out than an outer outline of the resonance region, further in than an outer outline of the air gap or an outer outline of the acoustic mirror, and surrounds the resonance region, the multilayered film is not located in a center region of the resonance region, and in at least a part of the region surrounding the resonance region, an outer outline of the multilayered film is located further in than the outer outline of the air gap or the outer outline of the acoustic mirror.

10. A filter comprising:

a piezoelectric thin film resonator including:
   a substrate;
   a piezoelectric film that is located on the substrate, and is formed of a lower piezoelectric film and an upper piezoelectric film that are stacked;
   a lower electrode and an upper electrode that face each other across at least a part of the piezoelectric film; and
   an insertion film that is inserted between the lower piezoelectric film and the upper piezoelectric film, wherein an air gap or an acoustic mirror that includes a resonance region defined by a region where the lower electrode and the upper electrode face each other across the piezoelectric film and that is larger than the resonance region in plan view is located under the lower electrode, and a multilayered film formed of the lower piezoelectric film, the insertion film, and the upper piezoelectric film that are stacked is located in at least a part of a region that is located further out than an outer outline of the resonance region, further in than an outer outline of the air gap or an outer outline of the acoustic mirror, and surrounds the resonance region, and the multilayered film is not located in the resonance region.

11. A duplexer comprising:

the filter according to claim 10.

* * * * *